United States Patent
Wang et al.

(10) Patent No.: US 9,312,286 B2
(45) Date of Patent: Apr. 12, 2016

(54) DISPLAY DEVICE HAVING BYPASS ELECTRODE ON COMMON ELECTRODE IN PERIPHERAL CIRCUIT OF COLOR FILTER SUBSTRATE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Lina Wang, Beijing (CN); Ran Tong, Beijing (CN); Manping Niu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 73 days.

(21) Appl. No.: 14/350,645
(22) PCT Filed: May 28, 2013
(86) PCT No.: PCT/CN2013/076317
§ 371 (c)(1),
(2) Date: Apr. 9, 2014
(87) PCT Pub. No.: WO2014/127590
PCT Pub. Date: Aug. 28, 2014

(65) Prior Publication Data
US 2015/0294995 A1 Oct. 15, 2015

(30) Foreign Application Priority Data
Feb. 21, 2013 (CN) .......................... 2013 1 0055870

(51) Int. Cl.
*H01L 27/12* (2006.01)
*G02F 1/1345* (2006.01)

(52) U.S. Cl.
CPC .......... *H01L 27/1244* (2013.01); *G02F 1/1345* (2013.01)

(58) Field of Classification Search
CPC .................................................. H01L 27/1244
See application file for complete search history.

(56) References Cited

U.S. PATENT DOCUMENTS

| | | | |
|---|---|---|---|
| 2006/0145154 A1* | 7/2006 | Choi et al. | 257/57 |
| 2008/0225196 A1* | 9/2008 | Kim | 349/54 |
| 2008/0259009 A1* | 10/2008 | Gao | 345/87 |
| 2010/0165280 A1* | 7/2010 | Ishitani et al. | 349/141 |

FOREIGN PATENT DOCUMENTS

| | | |
|---|---|---|
| CN | 201886251 U | 6/2011 |
| CN | 103116234 A | 5/2013 |

OTHER PUBLICATIONS

Written Opinion of the International Searching Authority dated Nov. 15, 2013; PCT/CN2013/076317.
International Search Report mailed Nov. 28, 2013; PCT/CN2013/076317.

* cited by examiner

*Primary Examiner* — Michael Jung
(74) *Attorney, Agent, or Firm* — Ladas & Parry LLP

(57) ABSTRACT

A display device includes an array substrate and a color filter substrate. The array substrate including data lines in a periphery circuit area, and the color filter substrate including a common electrode. A portion of the common electrode of the color filter substrate corresponding to the periphery circuit area of the array substrate includes a plurality of stripe electrodes separated from each other, extending in a length direction of the data lines and overlapped with the data lines. For each data line, two adjacent stripe electrodes among the plurality of stripe electrodes overlapped with the data line are connected through a bypass electrode which is substantially not overlapped with the data line. In case of the data lines being broken or shorted with the common electrode, the data line can be repaired by using a separate stripe electrode, thereby enabling normal operation of the circuitry.

17 Claims, 3 Drawing Sheets

DISPLAY DEVICE HAVING BYPASS ELECTRODE ON COMMON ELECTRODE IN PERIPHERAL CIRCUIT OF COLOR FILTER SUBSTRATE

BACKGROUND

The present invention relates to display technology, in particular, to a display device.

During a fabricating process of color filter (CF) substrate in fabricating TFT-LCD (Thin Film Transistor-Liquid Crystal Displays), an indium tin oxide (ITO) 2 is uniformly applied onto the entire color filter substrate by utilizing a conventional ITO Mask (Indium Tin Oxide Mask) of the CF substrate. ITO serves as a common electrode. As shown in FIG. 1, the CF substrate is completely covered by the ITO 2. In such design, it's unable to repair any failure caused by a broken data line 1 in the periphery circuit area of the array substrate as well as short circuit between the data line 1 on the array substrate and the ITO 2 on the CF substrate.

SUMMARY

In order to solve the technical problem above, the present disclosure provides a display device comprising an array substrate and a color filter substrate, the array substrate comprising data lines in a periphery circuit area, and the color filter substrate comprising a common electrode. A portion of the common electrode of the color filter substrate corresponding to the periphery circuit area of the array substrate comprises a plurality of stripe electrodes separated from each other, extending in a length direction of the data lines and overlapped with the data lines; for each data line, two adjacent stripe electrodes among the plurality of stripe electrodes overlapped with the data line are connected through a bypass electrode which is substantially not overlapped with the data line.

In an example, for each data line, each stripe electrode of the plurality of stripe electrodes has a pattern which is identical with a pattern of the data line overlapped therewith.

In an example, the pattern of the each stripe electrode has a width greater than a width of the pattern of the data line overlapped therewith; the pattern of the each stripe electrode and the pattern of the data line overlapped therewith have respective center lines in a length direction of the data line, the center lines have completely overlapped projections on the color filter substrate.

In an example, the pattern of the each stripe electrode has a width which is 5/4~7/5 times of a width of the data line overlapped therewith, and the stripe electrode has a length which is 18~25 times of the width of the data line overlapped therewith.

In an example, the pattern of the each stripe electrode has a width which is 4/3 times of the width of the data line overlapped therewith.

In an example, for each data line, two adjacent stripe electrodes among a plurality of stripe electrodes overlapped with the data line have a spacing which is 2~3 times of a width of the data line.

In an example, the bypass electrode has a width which is 1/8~1/5 of a width of the data line, and a maximum spacing between the bypass electrode and the data line is 1/5~1/3 of the width of the data line.

In an example, the bypass electrode has a width which is 1/6 of the width of the data line, and the maximum spacing between the bypass electrode and the data line is 1/4 of the width of the data line.

In an example, for adjacent data lines, a plurality of stripe electrodes overlapped with respective data lines are aligned at both ends in a width direction of the data lines.

In an example, the color filter substrate further comprise a plurality of connection electrodes connecting two stripe electrodes which corresponds to two adjacent data lines and are aligned at both ends in a width direction of the data lines.

In an example, the connection electrode has a stripe shape, and has a width which is 1~2 times of that of the data line.

In an example, the stripe electrode, bypass electrode and connection electrode are made of transparent conductive materials.

In an example, a first marking pole is disposed on the data line in the periphery circuit area of the array substrate at a position corresponding to the spacing between stripe electrodes corresponding to the data line.

In an example, a second marking pole is further disposed between two adjacent first marking poles at a location corresponding to the connection electrode.

In an example, the first marking pole and second marking pole have a width which is 1/6~1/4 of a width of the data line, and have a length which is 1/8~1/5 of the width of the data line.

In the present disclosure, the common electrode on the color filter substrate that is corresponding to the periphery circuit area of the array substrate is designed as separate stripe electrodes overlapped with the data line, and respective stripe electrodes corresponding to a same data line are connected through a bypass electrode which is not overlapped with the data line. In case of a broken data line or short circuit between the data line and the common electrode, the data line can be repaired by using the separate stripe electrode, thereby ensuring normal operation of the circuitry.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION OF THE PREFERRED EMBODIMENTS

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not intended to define a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Figure 1:
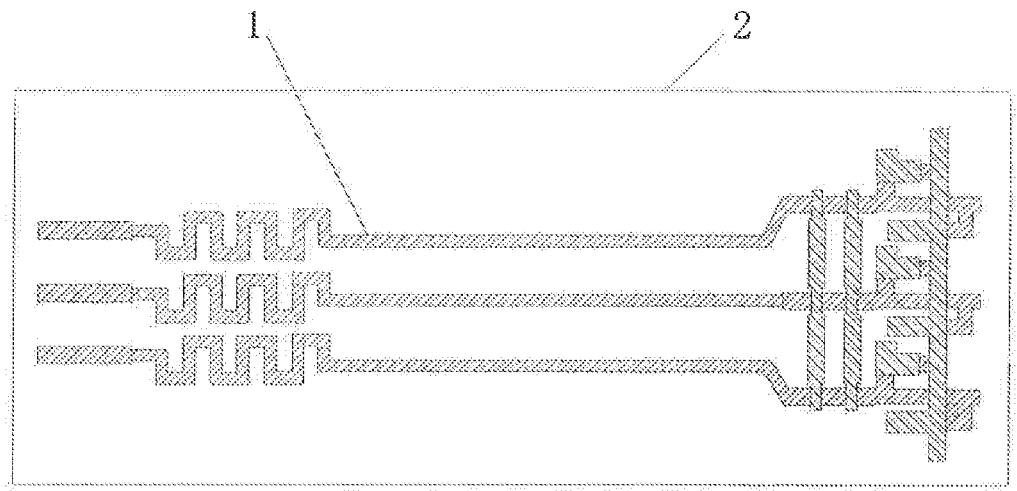
FIG. 1 shows patterns of data lines in a periphery circuit area of an array substrate and patterns of common electrode of a color filter substrate after cell assembling the color filter substrate and the array substrate according to prior art.
Figure 2:
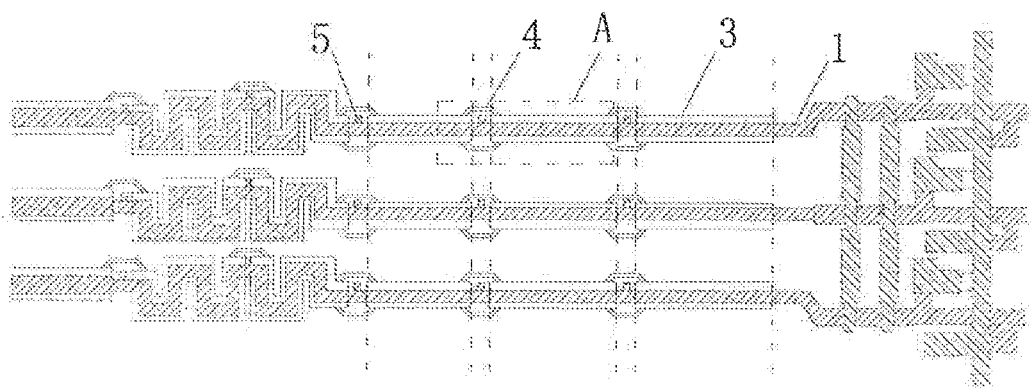
FIG. 2 shows patterns of data lines in the periphery circuit area of the array substrate and patterns of the common electrode of the color filter substrate after cell assembling the color filter substrate and the array substrate according to a first embodiment of the present disclosure.

In order to repair a broken data line in the periphery circuit area of the array substrate or shorting between the data line and the common electrode, the present embodiment designs a portion of common electrode on the color filter substrate that corresponds to the data lines in the periphery circuit area of the corresponding array substrate (the color filter substrate and the array substrate are assembled together to form a liquid crystal cell; that is, the array substrate is an array substrate to be cell assembled with the color filter substrate) to have a similar pattern as that of the data lines; for example, this portion may be designed as several separate segments of stripe electrodes; that is, a portion of the common electrode corresponding to a pixel electrode area of the corresponding array substrate may keep a block structure, while another portion of the common electrode corresponding to a periphery circuit area of the corresponding array substrate may have a pattern similar as that of the data lines in the periphery circuit area, and may have a pattern of several separate segments of stripe electrodes. As shown in FIG. 2, a portion of common electrode on the color filter substrate corresponding to one data line 1 in the peripheral circuit area of the array substrate comprises a plurality of separate stripe electrodes 3. Each of the stripe electrodes 3 extends in a length direction of the data line 1 and overlapped with the data line 1; that is, the data line 1 and of stripe electrode 3 have a partially overlapped projections on the color filter substrate. Since there is a spacing between the array substrate and the color filter substrate, the data line 1 on the array substrate would not contact with the stripe electrode 3 on the color filter substrate. FIG. 2 illustrates three data lines 1. For each data line 1, two adjacent stripe electrodes 3 in a plurality of stripe electrodes 3 overlapped with the data line 1 are connected through at least one bypass electrode 4 substantially not overlapped with the data line 1, for example, through two bypass electrodes 4 located at either side of the data line 1, respectively, as shown in FIG. 2. The pattern of common electrode in other areas of the color filter substrate may have a conventional block structure. The stripe electrode 3 of the common electrode near the pixel electrode area may be formed to be integrated with the common electrode in the pixel electrode area, while other stripe electrodes 3 are connected one another through the bypass electrode 4, thereby electrically connecting the whole common electrode together on the color filter substrate.

In order to avoid cutting the data line 1 upon cutting the bypass electrode 4 during repairing, the bypass electrode 4 and the data line 1 are preferably not overlapped at all.

Figure 3:
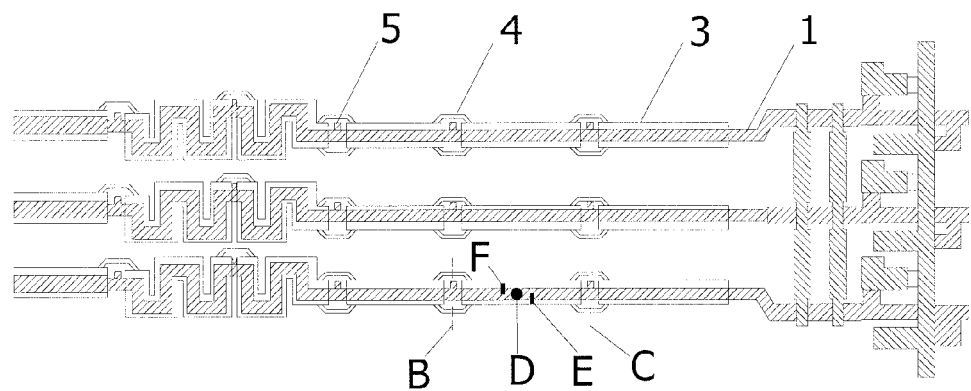
FIG. 3 shows a principle of repairing a broken data line in periphery circuit area of the array substrate or repairing short circuit between the data line and the stripe common electrode by using the stripe common electrode of the color filter substrate according to a first embodiment of the present disclosure.

As shown in FIG. 3, the data line in periphery circuit area is repaired by using stripe electrode 3 on the color filter substrate of the present embodiment based on following principles.

In case of a broken data line, for example as shown in FIG. 3, the data line 1 is broken at D, then E and F located at both ends of the breaking location D joint a stripe electrode 3 corresponding to the breaking location of the broken data line 1 with the data line 1 by means of laser welding, so as to electrically conduct the broken data line 1 through the stripe electrode 3. At the same time, in order to avoid any contact between the data line 1 and the common electrode, this segment of stripe electrode 3 is separated from other portions of the common electrode for example by cutting off the bypass electrodes which connect this segment of stripe electrode 3 to two adjacent stripe electrodes 3 using a laser; that is, cutting off bypass electrodes 4 at B and C as shown in FIG. 3, so as to finish the repair of the broken data line.

For short circuit between the data line and the common electrode caused for example by contamination, as shown in FIG. 3 for example, if the data line 1 is shorted at D, any contact between the data line 1 and the common electrode can be avoided by simply cutting off the bypass electrodes 4 at B and C.

Figure 4:
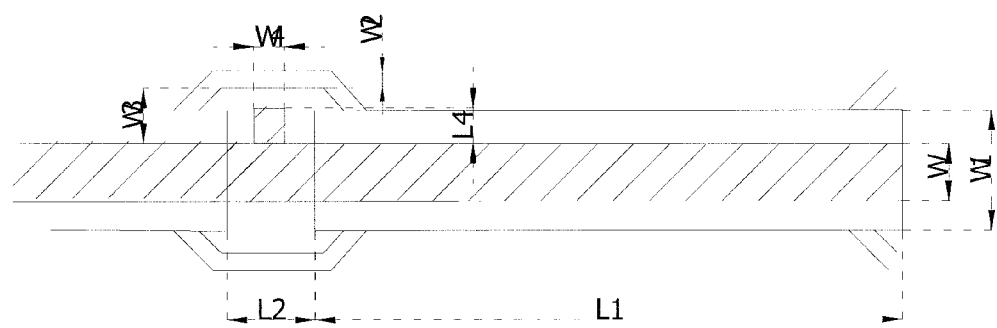
FIG. 4 is a partially enlarged view of part A in FIG. 2.

The pattern of each stripe electrode 3 and the pattern of data line 1 overlapped with the stripe electrode can have completely overlapped projections on the color filter substrate; that is, the pattern of stripe electrode 3 has a width equal to that of the pattern of data line 1. In this case, if any foreign substance is existed between the data line 1 and the stripe electrode 3, both of the data line 1 and the stripe electrode 3 may be broken at the same time, thereby the data line 1 can not be repaired by using the stripe electrode 3. Therefore, the pattern of each stripe electrode 3 can have a width greater than that of the pattern of the data line overlapped with the stripe electrode 3, so that the data line 1 and the stripe electrode 3 would not be simultaneously broken even if there was a foreign substance between the data line 1 and the stripe electrode 3. As shown in FIG. 4, the pattern of each stripe electrode 3 may have a width W1 which is 5/4~7/5 times of a width W of data line 1. In order to facilitate the welding and avoid overlap or contact between the stripe electrodes 3 corresponding to two adjacent data lines 1 during the fabrication of the stripe electrodes 3, the pattern of stripe electrode 3 has a width which is preferably 4/3 times of a width W of the data line 1. In order to further facilitate the welding, the stripe electrode 3 has a width W1 which is greater than a width W of the data line 1, and the pattern of each stripe electrode and the pattern of the data line overlapped with the stripe electrode are centered in a length direction of the data line 1; that is, the center lines of the stripe electrode and the data line can have completely overlapped projections on the color filter substrate.

A length L1 of the stripe electrode 3 is for example 18~25 times (e.g., 20 times) of a width W of the data line 1, and the length L1 can be set depending on the design of the data line of array substrate for different types of products. For each data line 1, two adjacent stripe electrodes 3 of the plurality of stripe electrodes 3 overlapped with the data line 1 have a spacing L2, which is for example 2~3 times of a width W of the data line 1. If the spacing between the two adjacent stripe electrodes 3 is excessively wide, it may be very difficult to repair the data line 1 when a data line 1 located at the spacing of two adjacent stripe electrodes 3 is broken. Preferably, the spacing L2 between two adjacent stripe electrodes 3 is 2 times of a width W of the data line 1.

Further, a width W2 of the bypass electrode 4 is for example 1/8~1/5 of a width W of the data line 1. A maximum spacing W3 between the bypass electrode 4 and the data line 1 is for example 1/5~1/3 of a width W of the data line 1. During the fabrication of bypass electrode 4, it is preferable to avoid a complete overlap between the bypass electrode 4 and a corresponding data line 1; otherwise it might adversely affect subsequent cutting process. Furthermore, it is preferable to avoid any overlap or contact between the bypass electrode 4 and an adjacent data line 1 or between the bypass electrode 4 and another bypass electrode 4 connected to the adjacent data line 1. Due to the above reasons, preferably, the width W2 of the bypass electrode 4 is 1/6 of the width W of the data line 1, and the maximum spacing W3 between the bypass electrode 4 and the data line 1 is 1/4 of the width W of the data line 1.

Further, in order to obtain more reliable connection between two stripe electrodes 3, for each data line, two adjacent stripe electrodes of a plurality of stripe electrodes overlapped with the data line are connected through two bypass electrodes 4 which are respectively located at both sides of the stripe electrodes 3 in a width direction.

Further, for adjacent data lines 1 on the array substrate, a plurality of stripe electrodes 3 corresponding to corresponding overlapped segments of respective data lines 1 are aligned in a width direction of the data line 1. As shown in FIG. 2 illustrated by dash aligning lines, the plurality of stripe electrodes 3 corresponding to respective overlapped segments of data lines 1 not only have the same shape and equal length, but also aligned in a width direction of the data line 1. Preferably, all the stripe electrodes 3 have the same shape and same length. In this way, it can facilitate the mask pattern design in the masking process for fabricating stripe electrodes 3.

Figure 5:
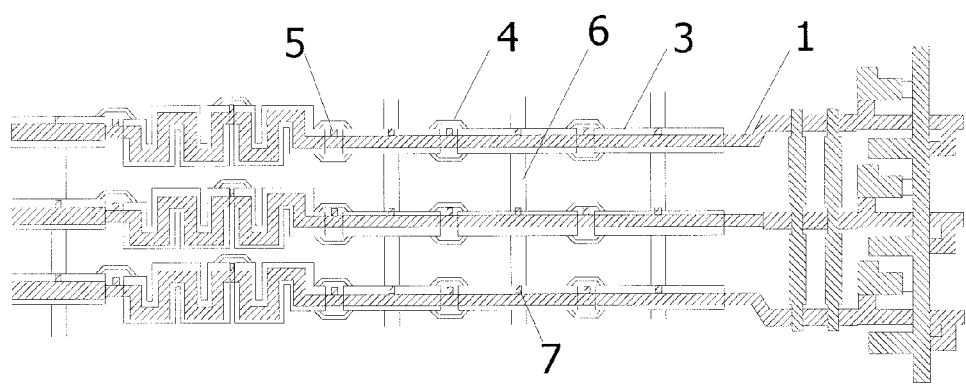
FIG. 5 shows patterns of data lines in the periphery circuit area of the array substrate and patterns of the common electrode on the color filter substrate after cell assembling the color filter substrate and the array substrate according to a second embodiment of the present disclosure.

Further, in order to prevent disconnection between a stripe electrode 3 on one data line 1 and an adjacent stripe electrode 3 due to the cutting after repairing so that the stripe electrode 3 overlapped with the data line 1 and close to the edge of the panel from can not be connected to the common electrode, the color filter substrate further comprises a plurality of connection electrodes 6 as shown in FIG. 5. The connection electrode 6 connects two stripe electrodes 3 which correspond to two adjacent data lines 1 respectively and aligned in a width direction of the data line 1; and the connection electrode is not overlapped with the bypass electrodes 4. In order to facilitate mask design in the masking process of fabricating stripe electrodes 3, preferably, the connection points of the connection electrode 6 connecting two stripe electrodes 3 are located in the middle of respective stripe electrodes 3 respectively. The connection electrode 6 may have a stripe shape with a width which is 1~2 times of that of the data line.

For repairing the circuitry of the color filter substrate with the connection electrode 6 as shown in FIG. 5, it is only necessary to further cut off the connection electrode 6 corresponding to the stripe electrode 3 used for repairing the circuitry.

The present disclosure further discloses a display device comprising an array substrate and the above-discussed color filter substrate which are cell assembled together.

Since a common electrode is usually made of a transparent conductive material, the stripe electrode 3, the bypass electrode 4 and the connection electrode 6 may be all transparent. Therefore, as shown in FIG. 2, in order to easily position the above-mentioned transparent electrodes during repairing the circuitry, a first marking pole 5 is disposed on the data line 1 in the peripheral circuit area of the array substrate at a location corresponding to the spacing between stripe electrodes 3. The first marking pole 5 and the data line 1 are formed in the same masking process by using the same material, for example an opaque metal. During the repair process, a segment of stripe electrode 3 and a bypass electrode 4 connected therewith can be positioned by searching the location of the first marking pole 5. As shown in FIG. 4, a width W4 of the first marking pole 5 may be 1/6~1/4 of a width W of the data line 1, e.g. 1/5; and a length L4 of the first marking pole 5 may be 1/8~1/5 of a width W of the data line 1, e.g. 1/6.

In order to recognize the location of above-mentioned connection electrode 6 better, a second marking pole 7 may be further disposed between two adjacent first marking poles 5 to position the location of the connection electrode 6, as shown in FIG. 5. The second marking pole 7 may have the same size and same shape with those of the first marking pole 5.

During fabricating patterns of respective electrodes of the array substrate and the color filter substrate, the positions of the first marking pole 5, the second marking pole 7, the stripe electrode 3, the bypass electrode 4 and the connection electrode 6 are predetermined by a masking process, thus ensuring that the patterns of electrodes as shown in FIG. 2 or FIG. 4 can be formed after cell assembling the array substrate and the color filter substrate.

The display device may be any product or component with display functions, such as a LCD panel, an electronic paper, an OLED panel, a mobile phone, a tablet PC, a television, a monitor, a laptop, a digital frame, and a navigator.

The above embodiments in only for illustrating the present disclosure and not for limiting the present disclosure. The skilled in the art can implement various modifications and variations without departing from the spirit and scope of the present disclosure, and all equivalent technical solutions fall into the scope of the present disclosure. The protection scope of the present disclosure is defined by appended claims.

What is claimed is:

1. A display device, comprising an array substrate and a color filter substrate, the array substrate comprising data lines in a periphery circuit area, and the color filter substrate comprising a common electrode; wherein a portion of the common electrode of the color filter substrate corresponding to the periphery circuit area of the array substrate comprises a plurality of stripe electrodes separated from each other, extending in a length direction of the data lines and overlapped with the data lines; for each data line, two adjacent stripe electrodes among the plurality of stripe electrodes overlapped with the data line are connected through a bypass electrode which is not overlapped with the data line.

2. The display device according to claim 1, wherein for each data line, each stripe electrode of the plurality of stripe electrodes has a pattern which is identical with a pattern of the data line overlapped with the stripe electrode.

3. The display device according to claim 2, wherein the pattern of the each stripe electrode has a width greater than a width of the pattern of the data line overlapped with the stripe electrode; the pattern of the each stripe electrode and the pattern of the data line overlapped with the stripe electrode have respective center lines in a length direction of the data line, the center lines have completely overlapped projections on the color filter substrate.

4. The display device according to claim 3, wherein the pattern of the each stripe electrode has a width which is 5/4~7/5 times of a width of the data line overlapped therewith, and the stripe electrode has a length which is 18~25 times of the width of the data line overlapped therewith.

5. The display device according to claim 2, wherein the pattern of the each stripe electrode has a width which is 5/4~7/5 times of a width of the data line overlapped therewith, and the stripe electrode has a length which is 18~25 times of the width of the data line overlapped therewith.

6. The display device according to claim 1, wherein the pattern of the each stripe electrode has a width which is 5/4~7/5 times of a width of the data line overlapped with the stripe electrode, and the stripe electrode has a length which is 18~25 times of the width of the data line overlapped with the stripe electrode.

7. The display device according to claim 6, wherein the pattern of the each stripe electrode has a width which is 4/3 times of the width of the data line overlapped with the stripe electrode.

8. The display device according to claim 1, wherein for each data line, two adjacent stripe electrodes among a plurality of stripe electrodes overlapped with the data line have a spacing which is 2~3 times of a width of the data line.

9. The display device according to claim 1, wherein the bypass electrode has a width which is 1/8~1/5 of a width of the data line, and a maximum spacing between the bypass electrode and the data line is 1/5~1/3 of the width of the data line.

10. The display device according to claim 9, wherein the bypass electrode has a width which is 1/6 of the width of the data line, and the maximum spacing between the bypass electrode and the data line is 1/4 of the width of the data line.

11. The display device according to claim 1, wherein for adjacent data lines, a plurality of stripe electrodes overlapped with respective data lines are aligned at both ends in a width direction of the data lines.

12. The display device according to claim 11, wherein the color filter substrate further comprise a plurality of connection electrodes connecting two stripe electrodes which corresponds to two adjacent data lines and are aligned at both ends in a width direction of the data lines.

13. The display device according to claim 12, wherein the connection electrode has a stripe shape, and has a width which is 1~2 times of that of the data line.

14. The display device according to claim 12, wherein the stripe electrode, bypass electrode and connection electrode are made of transparent conductive materials.

15. The display device according to claim 14, wherein a first marking pole is disposed on the data line in the periphery circuit area of the array substrate at a position corresponding to the spacing between stripe electrodes corresponding to the data line.

16. The display device according to claim 15, wherein a second marking pole is further disposed between two adjacent first marking poles at a location corresponding to the connection electrode.

17. The display device according to claim 16, wherein the first marking pole and the second marking pole have a width which is 1/6~1/4 of a width of the data line, and have a length which is 1/8~1/5 of the width of the data line.

* * * * *